Dec. 8, 1970 W. J. J. CHECINSKI 3,546,610
TRANSISTOR AMPLIFIER
Filed June 20, 1966
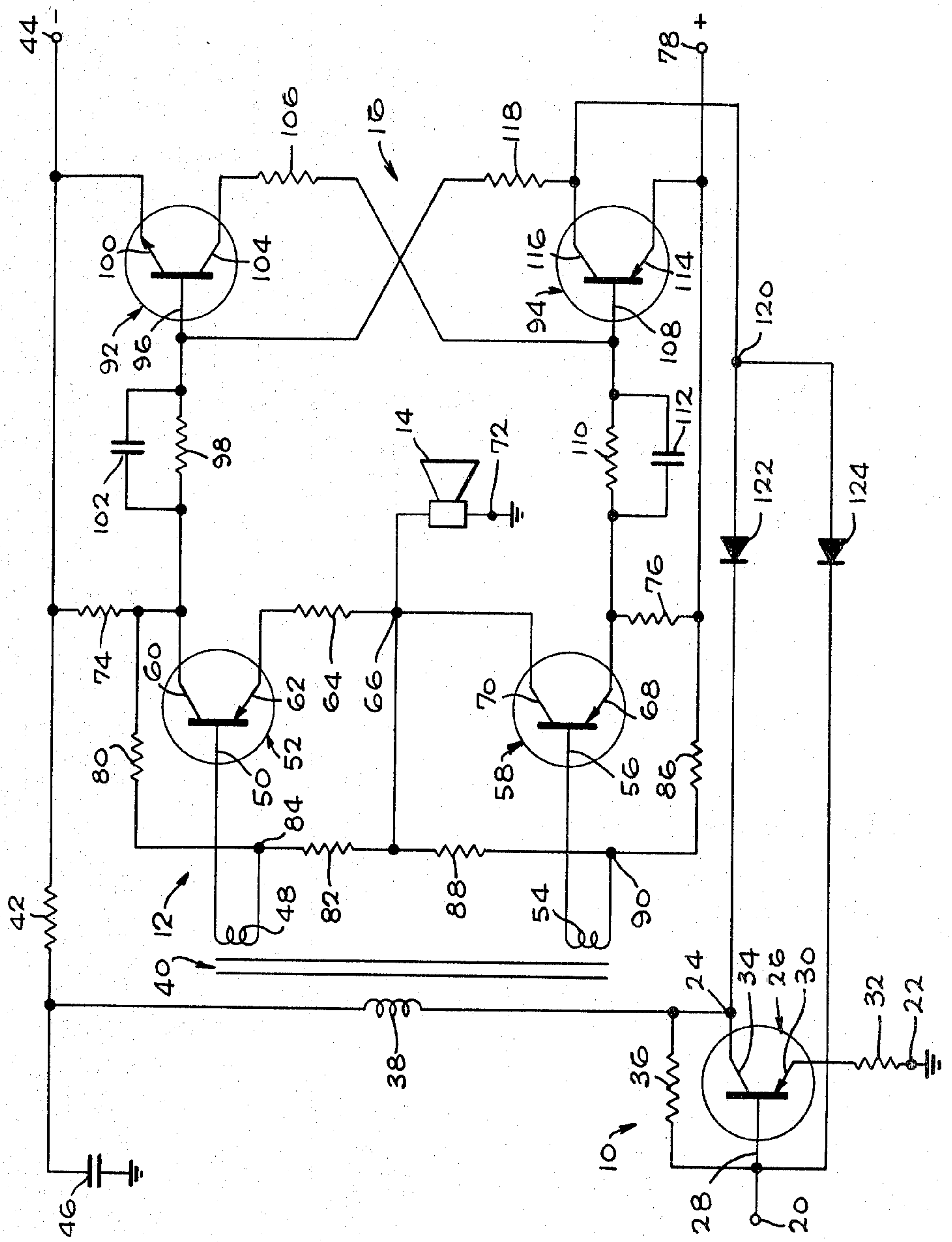
WIESLAW J. J. CHECINSKI
INVENTOR.
BY Flam and Flam
ATTORNEYS 3,546,610
TRANSISTOR AMPLIFIER Wieslaw J. J. Checinski, North Hollywood, Calif., assignor to Newcomb Electronics Corp., Los Angeles, Calif., a corporation of California Filed June 20, 1966, Ser. No. 558,711
Int. Cl. H03f 3/00, 21/00
U.S. Cl. 330—11 18 Claims

ABSTRACT OF THE DISCLOSURE

The improved concept resides in the protection of either side of a push-pull amplifier from excessive alternating signals. The circuitry for producing the protection includes biased switch means for connecting excessive signals, received at the input or output of said amplifier, to alternating ground on either cycle. Thus the amplifier is protected from excessive currents drawn by said amplifier and any other abnormal condition present in the amplifier.

This invention relates to amplifiers and, more particularly, to the protection of transistor amplifiers employed in loud speaker systems.

Transistor amplifiers of the push-pull type are frequently employed to drive loud speakers at very high power levels of the order, for example, of fifty watts. Such amplifiers are subject to the disadvantage, however, that overheating or other malfunctioning of one of the transistors of the push-pull output stage will cause an increase in the current drawn therethrough. If this increase in current is permitted to continue, there is a danger that the transistors of the push-pull output stage will become damaged irreparably.

Although there have been a number of proposals in the prior art for protecting transistor amplifiers from overload, none of these are suitable for the solution of the foregoing problem. It has been suggested, for example, in Schultz Pat. No. 2,860,196 and Battin Patent No. 3,061,785 to provide a diode across the signal path and to bias the diode so as to provide a low impedance path in response to overload conditions. Such prior art circuits are not, however, adapted to detect a malfunction on only one side of a push-pull amplifier stage. Moreover, since these prior art circuits rely on the biasing of the diode to accomplish the transistor protection, they are subject to a failure to operate properly in the event that a malfunctioning circuit causes unusual and unexpected bias voltage conditions. In the event that the trouble is marginal or intermittent, the prior art circuits will repeatedly block and unblock the signal path and possibly cause cumulative damage to the transistors.

Accordingly, it is the principal object of the invention to provide an improved amplifier circuit and more particularly an amplifier circuit which avoids the foregoing problems.

More specifically, it is an object of this invention to provide an amplifier with means for blocking the alternating current signal in response to excessive current drawn by eitehr side of a push-pull output stage.

An additional object of the invention is to provide an amplifier having means responsive to an abnormal condition of the amplifier for blocking the signal path and means for locking the blocking means in its signal blocking condition.

Another object of the invention is to provide a push-pull amplifier stage in which each side of the stage is provided with a sensing resistor, the voltage across which is monitored for detecting excessive current therethrough. A related object is the provision of a pair of transistor switches, each responsive to a respective one of the sensing resistors, and each cross-coupled to the other, whereby both switching transitors become conductive in response to excessive current in either side of the push-pull stage.

Still another object of the invention is the provision of an amplifier stage having positive switching means for coupling both the input and output sides thereof to signal ground in response to an abnormal condition.

Briefly, the invention contemplates the provision of a cascade transistor amplifier having a single-ended driver stage coupled to a push-pull output stage. The output stage has a common output terminal and means to connect a load, such as a loud speaker, between the common output terminal and a point of reference potential. A first transistor amplifying device has a load current path connected at one end to the common output terminal and at its other end through a sensing resistor to a source of bias voltage, which is grounded for alternating current signals. A second transistor amplifying device has a load current path connected at one end to the common output terminal and at its other end through a second sensing resistor to a second source of bias potential, also grounded for alternating current signals. A first transistor switch has its control circuit connected across the first sensing resistor, while a second transistor switch has its control circuit connected across the second sensing resistor. The two transistor switches are cross-coupled so that actuation of either transistor switch in response to a predetermined voltage across the corresponding sensing resistor will cause conduction of the other transistor switch. Both of the transistor switches are connected to their respective sources of bias voltage. A junction point is connected through the conductive path of one of the transistor switches to the corresponding bias voltage source, grounded for alternating current signals, and to the output electrode of the transistor driver stage through a first diode and to the input electrode of the driver stage through a second diode, both diodes being poled in the same sense with respect to the junction point. In this way, overheating or malfunctioning of either side of the push-pull amplifier stage to a degree sufficient to cause excessive current to flow through the corresponding sensing resistor will cause the corresponding transistor switch to become conductive. In turn, the other transistor switch will be made conductive due to the cross-coupling therebetween with the result that both transistor switches will become locked in their conductive state. By virtue of the connection of the junction point through the conduction path of one of the transistor switches to alternating current ground, both the input and output terminals of the driver stage will become effectively connected to alternating current signal ground thereby blocking alternating current signals from passing therethrough to the push-pull output stage.

The features of the present invention which are believed to be novel are set forth with particularity in the appended claims. The present invention, both as to its organization and manner of operation, together with further objects and advantages thereof, may best be understood by reference to the following description, taken in connection with the accompanying drawing, in which the single figure is a circuit diagram of an amplifier of the invention.

Turning to the drawing, it will be seen that an amplifier according to the present invention comprises a single-ended driver stage 10, a push-pull output stage 12, a loud speaker load device 14, and a control or switching stage 16.

Driver stage 10 comprises an input terminal 20, a common or ground terminal 22, and an output terminal 24. The stage includes a transistor amplifying device 26 which has a base electrode 28 connected to input terminal 20, an emitter electrode 30 connected through emitter resistor 32 to common terminal 22, and a collector electrode 34 connected to output terminal 24. In addition, a feedback resistor 36 is coupled between output terminal 24 and the input terminal 20 and base electrode 28 of the transistor 26. Collector electrode 34 is connected through a primary winding 38 of a coupling transformer 40 and an isolating resistor 42 to a terminal 44 of a source of bias voltage which, in a typical example, may be thirty volts negative. A by-pass capacitor 46 is provided for the bias circuit.

Returning to coupling transformer 40, it will be seen that it serves to couple the output signal from driver stage 10 to the push-pull output stage 12. A first secondary winding 48 is connected to the base electrode 50 of a transistor amplifying device 52 of stage 12. In like manner, a second secondary winding 54 is connected to the base electrode 56 of a transistor amplifying device 58 of stage 12.

As will be evident from the figure, transistors 52 and 58 are connected in push-pull fashion to form push-pull output stage 12. Transistor 52 provides a first load current path between its collector electrode 60, its emitter electrode 62, and emitter resistor 64 to a common output terminal 66 of stage 12. A second load current path is provided through transistor 58 and comprises the path between emitter electrode 68, collector electrode 70, and the common output terminal 66. As previously noted, the load consists of a loud speaker 14 which is connected between common output terminal 66 and a point of ground potential 72. The other end of the load current path through transistor 52 is connected through sensing resistor 74 to the terminal 44 of the source of negative bias voltage. The other end of the load current path through transistor 58 is connected in a similar way through sensing resistor 76 to a terminal 78 of a source of positive bias voltage which, in a typical example, may be thirty volts positive. It is to be understood with respect to bias source 44 and bias source 78 that both of these bias sources are effectively grounded for alternating current signals.

The circuit of transistor 52 also includes a pair of resistors 80 and 82 connected in series between sensing resistor 74 and common output terminal 66 to establish a bias voltage at junction 84, which is connected to base electrode 50 through winding 48. Similarly, a pair of resistors 86 and 88 are connected in series in the circuit of transistor 58 between, in this case, positive bias source terminal 78 and common output terminal 66, with secondary winding 54 connecting base electrode 56 to the bias voltage provided at junction 90 between resistors 86 and 88.

It will be apparent from the foregoing that the load current through transistor 52 will also traverse sensing resistor 74, while the load current through transistor 58 will pass through sensing resistor 76. Thus, the voltage across sensing resistor 74 will be a function of the load current through transistor 52, and the voltage across sensing resistor 76 will be a function of the load current through transistor 58. These voltages across sensing resistors 74 and 76 are employed to actuate switching means upon the passage of excessive current in the corresponding halves of the push-pull stage 12.

The control or switching stage 16 includes a pair of switching transistors 92 and 94. The base electrode 96 of transistor 92 is coupled to one side of sensing resistor 74 through resistor 98, while the emitter electrode 100 of this transistor is coupled to the other side of the sensing resistor 74, as well as to negative bias terminal 44. This circuit between base electrode 96 and emitter electrode 100 is thus effectively coupled across sensing resistor 74 and serves as the control circuit for switching transistor 92. A capacitor 102 is connected across coupling resistor 98 to improve the speed of response. The collector electrode 104 of transistor 92 is connected through a coupling resistor 106 to the base electrode 108 of transistor 94. The control circuit of switching transistor 94 is similarly connected across sensing resistor 76. One end of sensing resistor 76 is coupled to base electrode 108 through resistor 110, which is shunted by capacitor 112 to improve the speed of response. The other end of sensing resistor 76 is connected to emitter electrode 114 of transistor 94 and is also connected to positive bias source terminal 78. The collector electrode 116 of transistor 94 is coupled through coupling resistor 118 to the base electrode 96 of transistor 92. It will thus be seen that transistors 92 and 94 are cross-coupled to form a switching pair. It is also to be noted that transistor 92 is a NPN transistor, while transistor 94 is of the PNP conductivity type.

By virtue of the fact that the bias source terminals 44 and 78 are effectively at ground potential for alternating current signals, emitter electrodes 100 and 114 will be at alternating current signal ground when switching transistors 92 and 94 become conductive. Thus, a junction point 120 which is connected to collector electrode 116 of transistor 94 will become connected to alternating current ground upon conduction of transistor 94. Alternatively, junction point 120 may be connected to collector electrode 104 of transistor 92; in this case, it will become connected to alternating current signal ground upon conduction of transistor 92. Junction point 120 is connected through a diode 122 to output terminal 24 of driver stage 10, while a diode 124 is connected between junction point 120 and the input terminal 20 and base electrode 28 of driver stage 10. It is to be noted that both diode 122 and diode 124 are poled in the same sense with respect to junction point 120.

In considering the operation of the circuit of the invention, it is to be recalled that the amplifier is intended to operate with a very large power output, which may be as much as fifty watts, to drive speaker 14. The transistor 26 of driver stage 10 may operate with an alternating current input signal of between fifty-three millivolts to as much as one volt applied between terminals 20 and 22. Should either transistor 52 or transistor 58 become overheated or otherwise malfunction in such a way as to abnormally increase the current therethrough, the current drawn through the corresponding sensing resistor 74 or 76 will develop a voltage thereacross which will serve to detect the abnormality and cause operation of the control or switching stage 16 as hereafter described.

Since the operation of sensing resistor 74 is substantially identical to the operation of sensing resistor 76, only the operation of sensing resistor 74 will be described in detail. During normal conditions, resistor 74 has no effect upon the circuit operation and has no circuit function insofar as alternating current is concerned, although there may be a relatively small potential drop across the resistor. However, as transistor 52 draws excessive current, an increased voltage will be developed across sensing resistor 74 and be applied as an increased potential to the base 96 of switching transistor 92. When the increase in potential is sufficient, it will cause conduction of transistor 92 which, in turn, by drawing current through resistor 106, will switch on transistor 94. Transistor 94 will then, in turn, draw current through resistor 118 and continue to maintain the conductive condition of transistor 92. Accordingly, once either sensing resistor 74 or sensing resistor 76 has sufficient potential developed thereacross to switch on its corresponding switching transistor 92 or 94, both transistor 92 and transistor 94 are locked into the conducting condition and become independent of any other circuit conditions or functions.

Junction point 120 and diodes 122 and 124 may be connected to the collector of either transistor 92 or 94, the latter being shown. When transistor 94 is conducting, it will provide an alternating current short circuit effectively coupling collector electrode 116 to bias supply terminal 78, which is effectively an alternating current signal ground. Both diodes 122 and 124 will now be connected to alternating current signal ground with diode 122 being connected to the collector 34 and output terminal 24 of driver amplifier stage 10 and diode 124 being connected to input terminal 20 and base electrode 28 of that stage. The alternating current signal applied to driver stage 10 will thus be effectively shorted to alternating current signal ground in both cycle directions, thereby eliminating the application of the signal to the driver stage. This protective condition will continue until the power supply is turned off, because no other variations will have any effect whatsoever on the completely locked condition of transistors 92 and 94.

It is to be noted that resistors 106 and 118 are to be of a relatively large value to protect transistors 92 and 94 because, in their conducting condition, they are effectively across the power supply. Since transistors 92 and 94 are across the power supply during their conducting state, their break-down voltage should be sufficient to withstand the power supply potential. In the example shown, with bias voltages of thirty volts negative and thirty volts positive, transistors 92 and 94 should have ratings of sixty volts.

It is to be noted also that resistors 98 and 110 are employed as insulating resistors so that, when transistors 92 and 94 are effectively shorted by conduction, this will not be translated into increased conduction of transistors 52 and 58 one or both of these transistors 52 and 58 being already afflicted with excessive current troubles. Resistors 98 and 110 also constitute the collector supplies for transistors 94 and 92, respectively.

While a preferred embodiment of the invention has been shown and described, it will be apparent to those skilled in the art that changes and modifications can be made without departing from the principles and spirit of the invention, the scope of which is defined in the appended claims. Although the invention has been described with reference to a circuit employing transistors of the indicated conductivity types, it is to be understood that transistors of opposite conductivity types may be substituted with suitable reversal of the bias potentials. It is also to be understood that loads other than speakers may be employed as the load of the disclosed circuit. Accordingly, the foregoing embodiment is to be considered as illustrative rather than restrictive of the invention, and those modifications which come within the meaning and range of equivalency of the claims are to be included therein.

I claim:

1. An amplifier comprising:
a driver stage having an input electrode for receivng alternating current signals and an output electrode;
an output stage coupled to said output electrode;
sensing means coupled to said output stage for developing a switching voltage in response to excessive load current in said output stage; and
normally non-actuated switching means coupled to said sensing means, said switching means being actuated in response to said switching voltage and, when actuated, connecting said input electrode and said output electrode to a point grounded for alternating current signals for effectively shorting said alternating current signals from said input and output electrodes to said point grounded for alternating curernt signals.

2. An amplifier as defined in claim 1, wherein
said sensing means comprises a sensing resistor in series between a source of bias voltage and said output stage.

3. An amplifier as defined in claim 2, wherein
said switching means comprises a voltage-responsive switching device having a control circuit coupled across said sensing resistor.

4. An amplifier as defined in claim 3 wherein:
said switching device comprises a switching path between a junction and said joint grounded for alternating current signals; and said switching means further comprises first rectifier means connected between said junction and said input electrode, and second rectifier means connected between said junction and said output electrode, said rectifiers being poled in the same sense with respect to said junction.

5. An amplifier as defined in claim 4, wherein:
said driver stage comprises a transistor amplifier;
said input electrode comprises a base electrode; and
said output electrode comprises a collector electrode.

6. An amplifier as defined in claim 1, wherein:
said output stage comprises a push-pull stage having a first amplifying device and a second amplifying device, each of said amplifying devices having a load current path, said paths being connected at one end to a common output terminal;
said point grounded for alternating current signals comprises a first source of bias voltage of one polarity and said amplifier comprises a second source of bias voltage of opposite polarity, said sources of bias voltage being grounded for alternating current signals; and
said sensing means comprises a first sensing resistor connected between said first source and the other end of the load current path of said first amplifying device and a second sensing resistor connected between said second source and the other end of the load current path of said second amplifying device.

7. An amplifier as defined in claim 6, wherein
said amplifying devices are transistors.

8. An amplifier as defined in claim 6, wherein
said switching means comprises:
a first switching device having a control circuit connected across said first sensing resistor; and
a second switching device having a control circuit connected across said second sensing resistor.

9. An amplifier as defined in claim 8, wherein:
said switching devices are cross-coupled, whereby actuation of one of said switching devices causes actuation of the other of said switching devices to maintain both switching devices actuated; and
said input and output electrodes are connected through one of said switching devices to said point grounded for alternating current signals.

10. An amplifier as defined in claim 9 wherein
said switching devices are transistors.

11. An amplifier as defined in claim 6, further
comprising a loudspeaker load connected between said common output terminal and a point of reference potential.

12. An amplifier comprising:
a signal path for alternating current signals, said path being coupled to a push-pull stage;
said push-pull stage comprising a common output terminal, a first amplifying device having a load current path connected at one end to said common output terminal, the other end of said load current path being connected through a first sensing resistor to a first source of bias voltage grounded for alternating current signals, and a second amplifying device having a load current path connected at one end to said common output terminal, the other end of said load current path of said second device being connected through a second sensing resistor to a second source of bias voltage grounded for alternating current signals;
first voltage-responsive switching means having a control circuit coupled across said first sensing resistor;
second voltage-responsive switching means having a control circuit coupled across said second sensing resistor;
said first switching means, when activated, providing a conductive path between said first source of bias voltage and the control circuit of said second switching means;

said second switching means, when activated, providing a conductive path between said second source of bias voltage and the control circuit of said first switching means, whereby excessive current through either sensing resistor will cause the corresponding switching means to become activated and activation of said corresponding switching means will cause activation of the other switching means; and circuit means connecting said signal path to one of said sources of bias voltage through one of said switching means upon activation of said one of said switching means.

13. An amplifier as defined in claim 12, wherein said amplifiying devices are transistors and said switching means are transistors.

14. An amplifier as defined in claim 12, further comprising a loudspeaker load connected between said common output terminal and a point of reference potential.

15. An amplifier comprising:

a path for alternating current signals, said path being coupled to a push-pull stage;

said push-pull stage comprising a first load current path and a second load current path;

first normally non-conductive switch means;

means for rendering said first switch means conductive in response to an excessive current condition in said first load current path to establish a first conductive path;

second normally non-conductive switch means;

means for rendering said second switch means conductive in response to an excessive current condition in said second load current path to establish a second conductive path;

means for rendering said first switch means conductive in response to the establishment of said second conductive path;

means for rendering said second switch means conductive in response to the establishment of said first conductive path, whereby both said conductive paths are established in response to an excessive current condition in either of said load current paths; and circuit means for connecting said signal path through one of said conductive paths to a point grounded for alternating current signals.

16. An amplifier as defined in claim 15, wherein:

said signal path comprises a transistor amplifier stage; and said circuit means comprises diodes connected respectively to an input and an output electrode of said transistor amplifier stage.

17. An amplifier comprising:

an input terminal and an output terminal; and means for automatically grounding alternating current signals applied to said input terminal upon the occurrence of an abnormal condition comprising normally non-actuated switch means, said switch means being actuated in response to said condition for connecting a common junction point to a point grounded for said signals, first rectifier means connecting said common junction point to said input terminal, and second rectifier means connecting said common junction point to said output terminal, said first and second rectifier means being poled effectively to short said signal through said actuated switch means to ground in both cycle directions.

18. An amplifier as defined in claim 17, further comprising a transistor having a base electrode and a collector electrode, said input terminal being connected to said base electrode and said output terminal being connected to said collector electrode, said rectifier means being poled in the same sense with respect to said common junction point.

References Cited

UNITED STATES PATENTS

| | | | |
|---|---|---|---|
| 3,102,241 | 8/1963 | Johnstone | 330—22 |
| 3,139,590 | 6/1964 | Brown | 330—51X |
| 3,218,542 | 11/1965 | Taylor | 307—202X |

NATHAN KAUFMAN, Primary Examiner

U.S. Cl. X.R.

307—202; 330— 13, 24, 26, 30, 51